United States Patent
Aoki

(10) Patent No.: US 11,336,291 B2
(45) Date of Patent: May 17, 2022

(54) SEMICONDUCTOR DEVICE, MOTOR DRIVE CONTROL DEVICE, AND MOTOR UNIT

(71) Applicant: MINEBEA MITSUMI Inc., Nagano (JP)

(72) Inventor: Masato Aoki, Iwata (JP)

(73) Assignee: MINEBEA MITSUMI Inc., Nagano (JP)

(*) Notice: Subject to any disclaimer, the term of this patent is extended or adjusted under 35 U.S.C. 154(b) by 367 days.

(21) Appl. No.: 16/775,425

(22) Filed: Jan. 29, 2020

(65) Prior Publication Data
US 2020/0252075 A1 Aug. 6, 2020

(30) Foreign Application Priority Data
Feb. 1, 2019 (JP) .............................. JP2019-016750

(51) Int. Cl.
| | |
|---|---|
| H02P 6/12 | (2006.01) |
| H02P 6/15 | (2016.01) |
| H02P 6/18 | (2016.01) |
| H02P 6/20 | (2016.01) |
| H02P 6/22 | (2006.01) |
| H02H 7/08 | (2006.01) |
| H03M 1/18 | (2006.01) |
| H02P 27/08 | (2006.01) |

(Continued)

(52) U.S. Cl.
CPC ........... *H03M 1/183* (2013.01); *H02M 1/082* (2013.01); *H02P 27/08* (2013.01); *H02M 1/0009* (2021.05)

(58) Field of Classification Search
None
See application file for complete search history.

(56) References Cited

U.S. PATENT DOCUMENTS

| | | | |
|---|---|---|---|
| 9,093,931 B2 * | 7/2015 | Shibuya | H02P 23/24 |
| 10,236,804 B2 * | 3/2019 | Kaidu | H02P 29/032 |

(Continued)

FOREIGN PATENT DOCUMENTS

JP 2011-065746 A 3/2011

*Primary Examiner* — Kenneth B Wells
(74) *Attorney, Agent, or Firm* — Pearne & Gordon LLP

(57) ABSTRACT

A semiconductor device has an A/D converter configured to convert an analog signal representing a current flowing in a control target into a digital signal, an overcurrent determination unit configured to, based on the analog signal, determine that an overcurrent has occurred in the control target when the current flowing in the control target has exceeded an overcurrent threshold, and determine that the overcurrent has not occurred in the control target when the current flowing in the control target has not exceeded the overcurrent threshold, a drive control signal generation unit configured to generate a drive control signal for controlling driving of the control target so that the current flowing in the control target is equal to a target current, based on a conversion result of the A/D converter, and generate the drive control signal to reduce the current flowing in the control target when the overcurrent determination unit determines that the overcurrent has occurred, and an overcurrent threshold setting unit configured to set the overcurrent threshold based on the conversion result of the A/D converter and the target current.

9 Claims, 6 Drawing Sheets

(51) Int. Cl.
    *H02M 1/08*    (2006.01)
    *H02M 1/00*    (2006.01)

(56) References Cited

U.S. PATENT DOCUMENTS

| | | | | |
|---|---|---|---|---|
| 10,263,560 B2 * | 4/2019 | Kitano | ............... | H02P 6/06 |
| 10,476,415 B2 * | 11/2019 | Aoki | ............... | H02P 6/15 |
| 10,498,265 B2 * | 12/2019 | Aoki | ............... | H02P 6/08 |
| 10,886,863 B2 * | 1/2021 | Aoki | ............... | H02P 6/12 |
| 10,910,979 B2 * | 2/2021 | Kaidu | ............... | H02P 25/04 |
| 11,114,961 B2 * | 9/2021 | Kaidu | ............... | H02P 6/20 |

* cited by examiner

SEMICONDUCTOR DEVICE, MOTOR DRIVE CONTROL DEVICE, AND MOTOR UNIT

CROSS REFERENCE TO RELATED APPLICATIONS

This application claims the benefit of Japanese Patent Application No. 2019-016750, filed Feb. 1 2019, which is hereby incorporated by reference in its entirety.

BACKGROUND

Technical Field

The present disclosure relates to a semiconductor device, a motor drive control device, and a motor unit, and for example, relates to a semiconductor device having an analog-to-digital conversion circuit, a motor drive controller equipped with the semiconductor device, and a motor unit equipped with the motor drive control device and a motor.

Background

In a motor drive control device for controlling driving of a motor, a method of connecting a resistor (hereinafter, also referred to as a "sense resistor") between a winding forming a coil and a ground potential and detecting a voltage generated by a current flowing in the sense resistor is typically known as a method of detecting a current flowing through a coil of the motor (hereinafter, also referred to as a "motor current").

A detection value (voltage) of a motor current as an analog signal detected by the sense resistor is converted into a digital signal by an analog-to-digital converter, and then is input to the motor drive control device including a program processing device such as a CPU, to be used for drive control of the motor.

In the motor drive control device, a method using a ΔΣ modulation type A/D conversion circuit (hereinafter, also referred to as a "ΔΣADC") is known as a method of analog-to-digital converting a detection value of a motor current (see Japanese Patent Application Laid-Open No. 2011-65746). According to this method, in the ΔΣADC, the detection value (instantaneous value) of the motor current can be integrated to obtain an effective value of the motor current. Therefore, for example, when the constant current control is performed to control the motor current so that the motor current becomes a target current value, more stable motor drive can be performed as compared with a case where the constant current drive is performed based on the instantaneous value of the motor current.

SUMMARY

However, in general, in the ΔΣADC, a relatively long time (for example, about several tens ms) is required to perform the analog to digital conversion processing. Therefore, for example, when the motor load is increased rapidly while the motor is driven at a constant current, the effective value of the motor current cannot be calculated to keep pace with the rapid increase in the motor load. For this reason, the motor current may greatly exceed the target current value.

The present disclosure is related to preventing a current flowing in a control target from greatly exceeding a target value.

In accordance with an exemplary embodiment of the present disclosure, a semiconductor device includes an A/D converter configured to convert an analog signal representing a current flowing in a control target into a digital signal, an overcurrent determination unit configured to, based on the analog signal, determine that an overcurrent has occurred in the control target when the current flowing in the control target has exceeded an overcurrent threshold, and determine that the overcurrent has not occurred in the control target when the current flowing in the control target has not exceeded the overcurrent threshold, a drive control signal generation unit configured to generate a drive control signal for controlling driving of the control target so that the current flowing in the control target is equal to a target current, based on a conversion result of the A/D converter, and generate the drive control signal to reduce the current flowing in the control target when the overcurrent determination unit determines that the overcurrent has occurred, and an overcurrent threshold setting unit configured to set the overcurrent threshold based on the conversion result of the A/D converter and the target current.

The semiconductor device according to the present disclosure makes it possible to ensure that a current flowing in a control target does not exceed greatly a target value.

DETAILED DESCRIPTION

1. Outline of Embodiment

Figure 1:
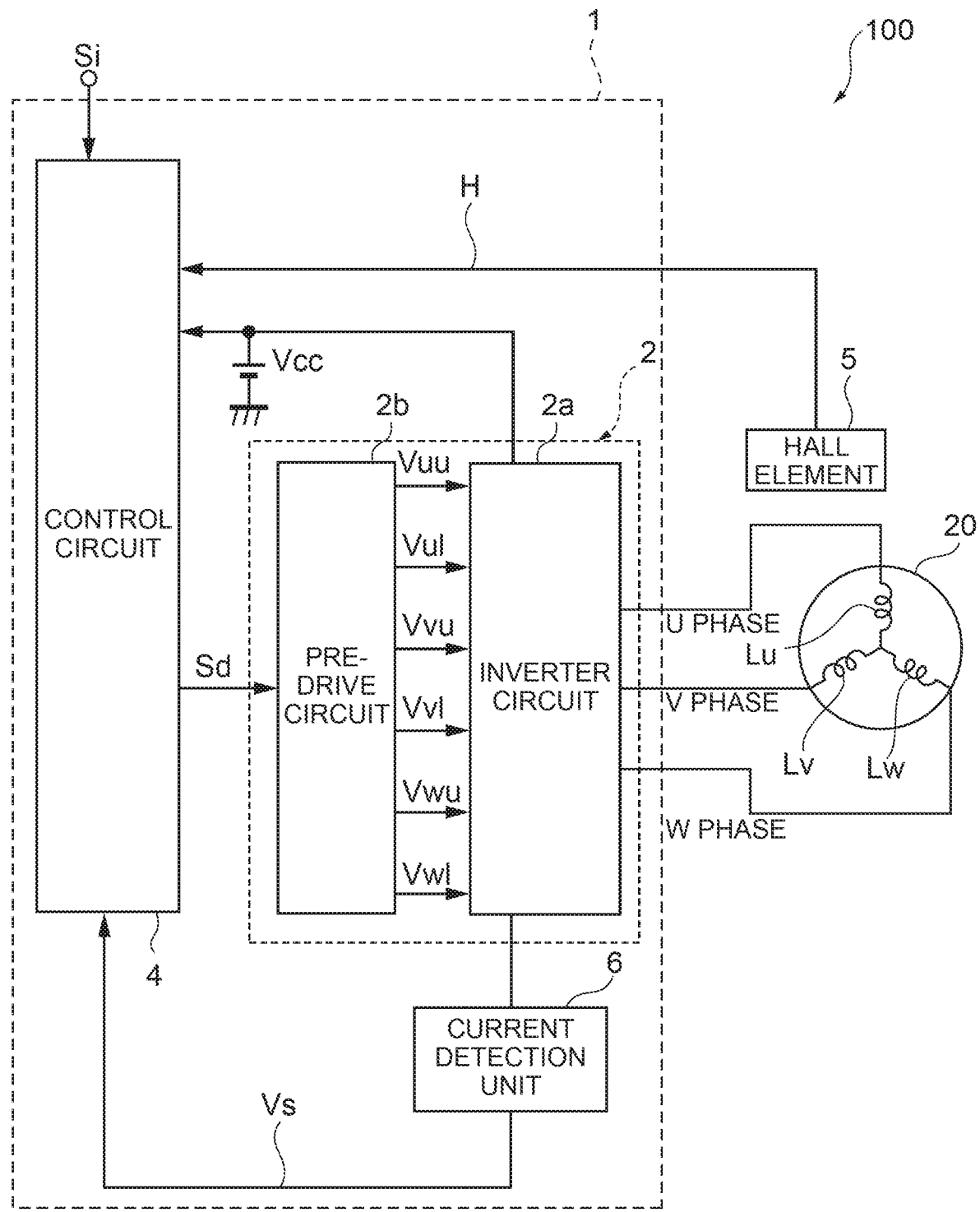
FIG. 1 is a block diagram illustrating a configuration of a motor unit according to an embodiment of the present disclosure.

Firstly, an outline of an exemplary embodiment of the disclosure disclosed in the present application will be described. Note that in the following description, the reference numerals in the drawings corresponding to components of the disclosure are enclosed in parentheses, as an example.

[1] A semiconductor device (4) according to an exemplary embodiment of the present disclosure includes an A/D converter (45) configured to convert an analog signal representing a current flowing in a control target (20) into a digital signal, an overcurrent determination unit (46) configured to, based on the analog signal, determine that an overcurrent has occurred in the control target when the current flowing in the control target has exceeded an overcurrent threshold (Ith), and determine that the overcurrent has not occurred in the control target when the current flowing in the control target has not exceeded the overcurrent threshold, a drive control signal generation unit (42)

configured to generate a drive control signal (Sd) for controlling driving of the control target so that the current flowing in the control target is equal to a target current (Itg), based on a conversion result (Ie) of the A/D converter, and generate the drive control signal to reduce the current flowing in the control target when the overcurrent determination unit determines that the overcurrent has occurred, and an overcurrent threshold setting unit (47) configured to set the overcurrent threshold (Ith) based on the conversion result (Ie) of the A/D converter and the target current (Itg).

[2] In the above-described semiconductor device, the overcurrent threshold setting unit may reduce the overcurrent threshold when the conversion result of the A/D converter is larger than the target current, and may increase the overcurrent threshold when the conversion result of the A/D converter is smaller than the target current.

[3] In the above-described semiconductor device, the overcurrent threshold setting unit may reduce the overcurrent threshold when the conversion result (Ie) of the A/D converter is larger than a predetermined current range (Rm) taking the target current as a reference, may increase the overcurrent threshold when the conversion result of the A/D converter is smaller than the predetermined current range (Rm), and may set the overcurrent threshold based on a determination result (Scmp) by the overcurrent determination unit when the conversion result of the A/D converter is in the predetermined current range (Rm).

[4] In the above-described semiconductor device, an adjustment amount (±Δ) of the overcurrent threshold when the conversion result of the A/D converter is in the predetermined current range may be smaller than an adjustment amount (±2Δ) of the overcurrent threshold when the conversion result of the A/D converter is out of the predetermined current range.

[5] In the above-described semiconductor device, the overcurrent threshold setting unit may increase the overcurrent threshold in the event that the overcurrent determination unit determines that the overcurrent has occurred when the conversion result of the A/D converter is in the predetermined current range (Rm).

[6] In the above-described semiconductor device, the overcurrent threshold setting unit may determine whether the overcurrent threshold has been changed, based on an occurrence history (470) of the overcurrent in the event that the overcurrent determination unit determines that the overcurrent has not occurred when the conversion result of the A/D converter is in the predetermined current range (Rm).

[7] In the above-described semiconductor device, the overcurrent threshold setting unit may change an initial value (Ith0) of the overcurrent threshold in response to the change of the target current, and may change the overcurrent threshold from the initial value based on a relative magnitude of the conversion result of the A/D converter with respect to the target current.

[8] A motor drive control device (1) according to an exemplary embodiment of the present disclosure includes the above-described semiconductor device (4), a current detection circuit (6) configured to output a voltage Vs corresponding to a current flowing in a motor (20) serving as the control target, and a motor drive unit (2) configured to drive the motor based on the drive control signal generated by the semiconductor device, wherein the semiconductor device inputs a voltage output from the current detection circuit as the analog signal.

[9] A motor unit (100) according to an exemplary embodiment of the present disclosure includes the above-described motor drive control device (1) and the motor (20).

2. Specific Example of Embodiment

Hereinafter, a specific example of an embodiment of the present disclosure will be described with reference to the drawings. Note that in the following description, the components that are the same as those in each embodiment are assigned with the same reference numerals, and description of such portions is not repeated.

FIG. 1 is a block diagram illustrating a configuration of a motor unit according to an embodiment of the present disclosure.

As illustrated in FIG. 1, the motor unit 100 includes a motor (an example of the control target) 20, and a motor drive control device 1 configured to drive the motor 20. The motor unit 100 is applicable to various devices that use a motor such as a fan as a power source, for example.

In the present embodiment, the motor 20 is, for example, a three-phase brushless motor having coils Lu, Lv and Lw. The motor drive control device 1 periodically applies a driving current to the three-phase coils Lu, Lv and Lw forming the motor 20 to rotate the motor 20.

The motor drive control device 1 drives the motor 20. More specifically, the motor drive control device 1 includes a motor drive unit 2, a control circuit 4, and a current detection circuit 6. Note that some of all components of the motor drive control device 1 are illustrated in FIG. 1, and the motor drive control device 1 may include other components in addition to the components illustrated in FIG. 1.

In the present embodiment, at least part of the motor drive control device 1 is packaged as one semiconductor device (Integrated Circuit (IC)). For example, circuits such as the control circuit 4 and the motor drive unit 2 are implemented as respective separate semiconductor devices.

Note that the entire motor drive control device 1 may be packaged to form a semiconductor device or the entire or part of the motor drive control device 1 may be packaged together with another device to form one semiconductor device.

The motor drive unit 2 outputs, based on a drive control signal Sd output from the control circuit 4, a driving signal to the motor 20 to drive the motor 20. The motor drive unit 2 selectively energizes the coils Lu, Lv and Lw of a plurality of phases of the motor 20.

More specifically, the motor drive unit 2 includes an inverter circuit 2a and a pre-drive circuit 2b. The pre-drive circuit 2b generates an output signal for driving the inverter circuit 2a based on the drive control signal Sd output from the control circuit 4, and outputs the signal to the inverter circuit 2a. The inverter circuit 2a energizes the coils Lu, Lv and Lw included in the motor 20, based on the signal output from the pre-drive circuit 2b.

More specifically, the inverter circuit 2a is formed so that pairs of two switching elements connected in series across a power supply voltage (direct current power supply) Vcc are disposed with respect to respective phases (a U phase, a V phase, and a W phase) of the coils Lu, Lv and Lw, for example. In each pair of the two switching elements, a terminal of each phase of the motor 20 is connected to a connection point between the switching elements (not illustrated). The pre-drive circuit 2b outputs, as output signals, for example, six types of signals Vuu, Vul, Vvu, Vvl, Vwu and Vwl corresponding to the respective switching elements of the inverter circuit 2a. When these signals Vuu, Vul, Vvu, Vvl, Vwu and Vwl are output, the switching elements corresponding to the respective signals Vuu, Vul, Vvu, Vvl, Vwu and Vwl perform an on/off operation. Thus, a driving signal is output to the motor 20, and a current flows in the coils Lu, Lv and Lw of the respective phases of the motor 20 (not illustrated).

The current detection circuit 6 is a functional part for detecting a current (motor current) flowing in the coils Lu, Lv and Lw of the motor 20. A configuration of the current detection circuit 6 will be described later.

The control circuit (an example of the semiconductor device) 4 is comprised of, for example, a microcomputer, a digital circuit, and an analog circuit, and the like. A speed command signal Sc and a current command signal Si, as signals instructing driving of the motor 20, are input to the control circuit 4. The control circuit 4 performs the drive control of the motor 20 based on these signals. These signals are input from a device such as a host device provided outside the control circuit 4, for example.

The speed command signal Sc is a signal relating to a rotational speed of the motor 20. For example, the speed command signal Sc is a PWM (Pulse Width Modulation) signal corresponding to a target rotational speed of the motor 20. In other words, the speed command signal Sc is information corresponding to a target value of the rotational speed of the motor 20. Note that a clock signal may be input as the speed command signal Sc.

The current command signal Si is a signal relating to a motor current of the motor 20. For example, the current command signal Si is a signal including information of a target value of the current flowing in each of the coils Lu, Lv and Lw forming the motor 20 (hereinafter, also referred to as a "target current Itg"). Here, the current command signal Si may be, for example, a PWM signal corresponding to the target current Itg, or may be a clock signal.

In the present embodiment, a hall signal (a position detection signal) H is input from the motor 20 to the control circuit 4. The hall signal H is an output of a hall element 5 disposed in the motor 20, for example. The hall signal H is a signal corresponding to a rotation of a rotor (not illustrated) of the motor 20. The control circuit 4 obtains actual rotational speed information on an actual rotational speed of the rotor of the motor 20 using the hall signal H, and controls driving of the motor 20.

Note that although FIG. 1 illustrates an example in which one hall element 5 is disposed in a motor unit 100, the number of hall elements 5 to be disposed in the motor unit 100 is not limited in particular. For example, three hall elements 5 may be disposed around the rotor of the motor 20 at substantially equal intervals one from another.

Note that in addition to such a hall signal H or instead of the hall signal H, another information on a rotational state of the motor 20 may be input to the control circuit 4. For example, a signal (pattern FG) generated using a coil pattern provided on a substrate on a rotor side may be input to the control circuit 4, as an FG signal corresponding to the rotation of the rotor of the motor 20. The rotation state of the motor 20 may be detected based on a detection result of a rotational position detection circuit for detecting a back electromotive force induced in each phase (the U phase, the V phase, and the W phase) of the motor 20. An encoder or a resolver may be provided to detect the information on the rotational speed and the like of the motor 20.

The control circuit 4 generates the drive control signal Sd for driving the motor 20 based on the current command signal Si, the speed command signal Sc, the hall signal H, and the like. For example, the control circuit 4 generates the drive control signal Sd so that the motor 20 rotates at a rotational speed corresponding to the speed command signal Sc and the current flowing in the coils Lu, Lv and Lw of the motor 20 is constant.

The drive control signal Sd is, for example, a PWM (Pulse Width Modulation) signal. The control circuit 4 supplies, to the motor drive unit 2, the drive control signal Sd that is the PWM (Pulse Width Modulation) signal, and thereby controls the driving of the motor 20 while switching among the energization phases of the coils Lu, Lv and Lw of a plurality of phases energized by the motor drive unit 2 in a predetermined order.

The control circuit 4 according to the present embodiment has a current limiting function of dynamically changing the overcurrent threshold Ith for overcurrent protection of the motor 20 during the constant current control of the current (motor current) flowing in the coils Lu, Lv and Lw of the motor 20 so that the motor current does not greatly exceed the target current Itg even when the load of the motor 20 changes rapidly. Hereinafter, this function will be described in detail.

Figure 2:
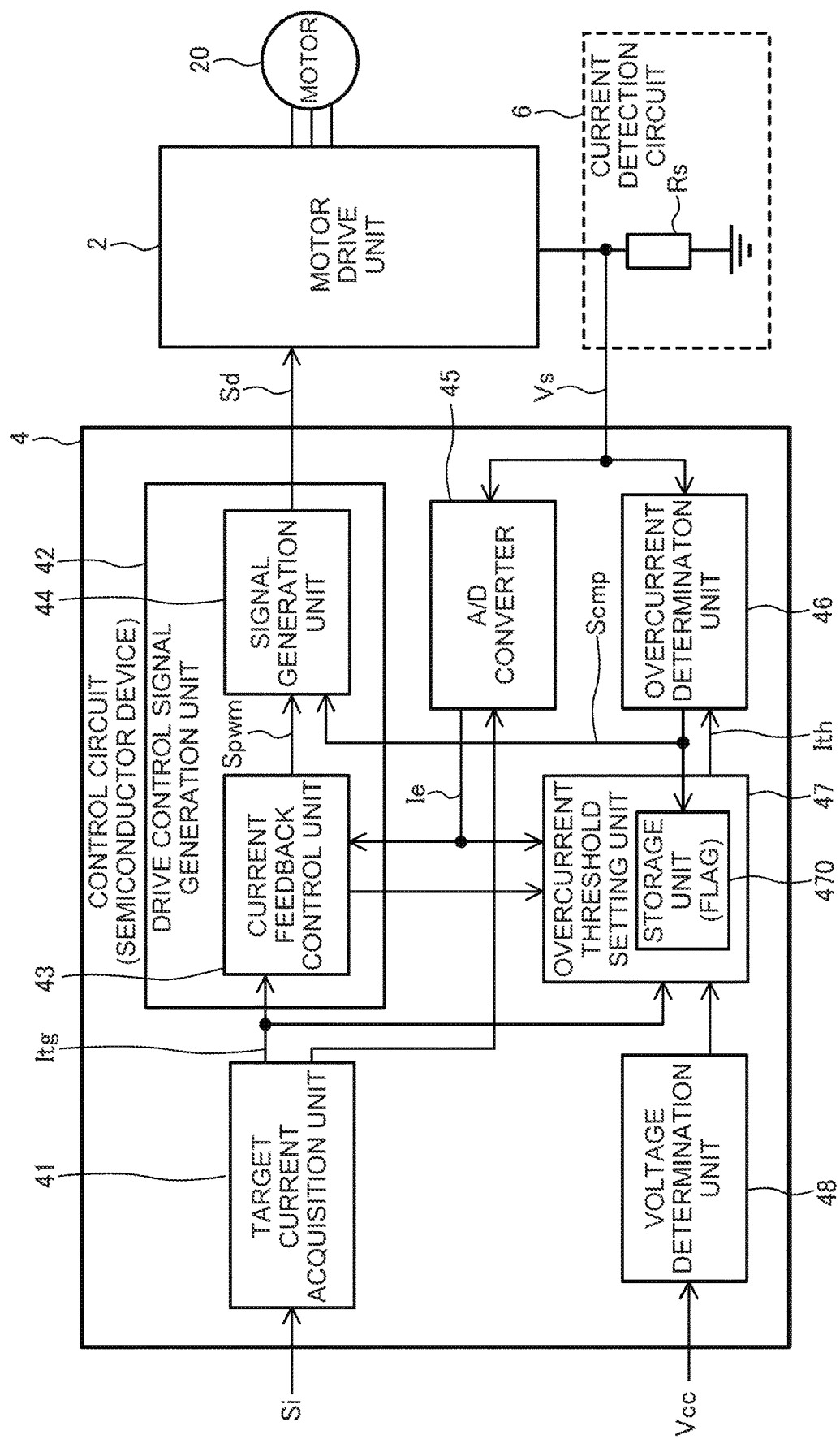
FIG. 2 is a block diagram illustrating a configuration of a semiconductor device (control circuit 4) according to an embodiment of the present disclosure.

FIG. 2 is a block diagram illustrating a configuration of the control circuit 4.

FIG. 2 illustrates a functional block relating to the above-described current limiting function among the functional blocks forming the control circuit 4.

As illustrated in FIG. 2, the control circuit 4 includes a target current acquisition unit 41, a drive control signal generation unit 42, an A/D converter 45, an overcurrent determination unit 46, an overcurrent threshold setting unit 47, and a voltage determination unit 48.

The target current acquisition unit 41 acquires the current command signal Si output from the host device provided outside the motor unit 100, for example. More specifically, the target current acquisition unit 41 acquires information of the target current Itg included in the current command signal Si, and supplies the information to the drive control signal generation unit 42 and the overcurrent threshold setting unit 47. When receiving the current command signal Si, the target current acquisition unit 41 instructs the A/D converter 45 to execute A/D conversion processing. Note that the target current acquisition unit 41 may issue the instruction of execution of the A/D conversion processing every time the target current acquisition unit 41 receives the current command signal Si (every time the target current Itg is changed) or may issue the instruction only when the target current acquisition unit 41 first receives the current command signal Si.

The target current acquisition unit 41 includes, for example, an external interface circuit and the like of the microcontroller.

The A/D converter 45 is a functional part that converts an analog signal representing a current flowing in the motor 20 serving as a control target into a digital signal. The A/D converter 45 is, for example, a ΔΣ modulation type analog-to-digital conversion circuit (ΔΣADC), and is formed by a dedicated logic circuit. The A/D converter 45 inputs a signal output from the current detection circuit 6, as the analog signal, and converts the signal into the digital signal using a ΔΣ modulation system.

Here, the current detection circuit 6 is a circuit for outputting a voltage Vs corresponding to the current (motor current) flowing in the motor 20 serving as the control target, as described above. For example, as illustrated in FIG. 2, the current detection circuit 6 includes a resistor Rs (hereinafter, also referred to as a "sense resistor Rs") connected in series with the motor drive unit 2 between the coils of the motor 20 and a ground potential, and outputs the voltage Vs generated across the sense resistor Rs as a detection value of the motor current of the motor 20.

The A/D converter 45 converts the voltage Vs that is an analog signal output from the current detection circuit 6 into a digital signal, and outputs the digital signal as an effective value (an example of the conversion result of the A/D converter) Ie of the motor current of the motor 20. For example, when receiving a command to instruct execution of the A/D conversion processing from the target current acquisition unit 41, the A/D converter 45 starts the A/D conversion processing for the voltage Vs. For example, after receiving the command from the target current acquisition unit 41, the A/D converter 45 continues to execute the A/D conversion processing for the voltage Vs until the A/D converter 45 receives a command to instruct stop of the A/D conversion processing, and outputs a conversion result (effective value Ie of the motor current) of the A/D converter 45 for each predetermined processing cycle.

The overcurrent determination unit 46 is a functional part that determines whether the motor current of the motor 20 exceeds the overcurrent threshold Ith based on the analog signal representing the current flowing in the motor 20 serving as the control target. The overcurrent determination unit 46 includes, for example, a comparator circuit.

The comparator circuit forming the overcurrent determination unit 46 compares the voltage Vs output from the current detection circuit 6 with a threshold voltage Vth corresponding to the overcurrent threshold Ith. When the voltage Vs is larger than the threshold voltage Vth, the comparator circuit forming the overcurrent determination unit 46 determines that the overcurrent has occurred in the motor 20, and, for example, outputs a high level determination signal Scmp. On the other hand, when the voltage Vs is smaller than the threshold voltage Vth, the comparator circuit forming the overcurrent determination unit 46 determines that the overcurrent has not occurred in the motor 20, and, for example, outputs a low level determination signal Scmp.

The drive control signal generation unit 42 is a functional part that generates the drive control signal Sd for controlling driving of the motor 20 serving as the control target. The drive control signal generation unit 42 generates the drive control signal Sd so that the motor current is equal to the target current Itg, based on a conversion result of the A/D converter 45, and generates the drive control signal Sd to reduce the motor current when the overcurrent determination unit 46 determines that the overcurrent has occurred (when the overcurrent determination unit 46 determines that the motor current has exceeded the overcurrent threshold Ith).

More specifically, the drive control signal generation unit 42 includes a current feedback control unit 43 and a signal generation unit 44.

The current feedback control unit 43 outputs a PWM command signal Spwm designating a duty ratio of the PWM signal as the drive control signal Sd, based on the target current Itg output from the target current acquisition unit 41 and the effective value Ie of the motor current output from the A/D converter 45. More specifically, the current feedback control unit 43 calculates the duty ratio of the PWM signal so that a difference between the target current Itg and the effective value Ie of the motor current becomes zero, and outputs, as the PWM command signal Spwm, information including the calculated duty ratio.

The current feedback control unit 43 outputs the above-described information of the duty ratio of the PWM signal to the overcurrent threshold setting unit 47. Note that the above-described information of the duty ratio may be the PWM command signal Spwm.

The signal generation unit 44 generates the drive control signal Sd based on the PWM command signal Spwm output from the current feedback control unit 43 and the determination signal Scmp output from the overcurrent determination unit 46. More specifically, when the determination signal Scmp indicating that the overcurrent has not occurred (for example, a low level determination signal Scmp) is output from the overcurrent determination unit 46, the signal generation unit 44 generates the PWM signal having the duty ratio designated by the PWM command signal Spwm, and outputs the PWM signal as the drive control signal Sd. On the other hand, when the determination signal Scmp indicating that the overcurrent has occurred (for example, the high level determination signal Scmp) is output from the overcurrent determination unit 46, the signal generation unit 44 generates the drive control signal Sd to reduce the motor current regardless of the PWM command signal Spwm. That is, the signal generation unit 44 generates the PWM signal having the duty ratio of 0% and outputs the PWM signal as the drive control signal Sd to reduce the motor current rapidly.

The voltage determination unit 48 is a functional part that determines a magnitude of the power supply voltage Vcc of the motor drive unit 2. That is, the voltage determination unit 48 detects the power supply voltage Vcc to be applied to the coils Lu, Lv and Lw, the power supply voltage Vcc serving as a reference for the output signal of the inverter circuit 2a, and output the information indicating the magnitude of the power supply voltage Vcc to the overcurrent threshold setting unit 47. The voltage determination unit 48 includes, for example, the A/D conversion circuit and the like.

The current feedback control unit 43 and the signal generation unit 44 are implemented by the program processing in the microcontroller (CPU), for example. Note that the signal generation unit 44 may be implemented by the dedicated logic circuit.

The overcurrent threshold setting unit 47 is a functional part that sets the overcurrent threshold Ith serving as a reference for the overcurrent determination by the overcurrent determination unit 46. The overcurrent threshold setting unit 47 is implemented by the program processing in the microcontroller (CPU).

The overcurrent threshold setting unit 47 first sets an initial value Ith0 of the overcurrent threshold Ith. For example, the overcurrent threshold setting unit 47 calculates the initial value Ith0 of the overcurrent threshold Ith using a relational expression indicating a correspondence between the overcurrent threshold Ith and the target current Itg, the power supply voltage Vcc and the duty ratio of the PWM signal, which are stored in a storage device in the microcontroller in advance. That is, the overcurrent threshold setting unit 47 calculates the initial value Ith0 (Itg) of the overcurrent threshold Ith by substituting, in the above-described relational expression, the information of the target current Itg acquired from the target current acquisition unit 41, the information of the power supply voltage Vcc acquired from the voltage determination unit 48, and the information of the duty ratio of the PWM signal acquired from the current feedback control unit 43 as variables.

Note that a method of calculating the initial value of the overcurrent threshold Ith is not limited to a method using the above-described relational expression. For example, the overcurrent threshold setting unit 47 may calculate the initial value Ith0 of the overcurrent threshold Ith by reference to a table (lookup table) indicating the correspondence between the overcurrent threshold Ith and the target current Itg, the power supply voltage Vcc and the duty ratio, which are stored in a storage device in the microcontroller in advance, based on the information of the target current Itg acquired from the target current acquisition unit 41, the information of the power supply voltage Vcc acquired from the voltage determination unit 48, and the information of the duty ratio of the PWM signal acquired from the current feedback control unit 43.

The overcurrent threshold setting unit 47 changes the initial value Ith0 of the overcurrent threshold Ith, in response to the change of the target current Itg. That is, when receiving the information indicating new target current Itg from the target current acquisition unit 41, the overcurrent threshold setting unit 47 changes the initial value Ith0 of the overcurrent threshold Ith using the above-described relational expression or lookup table based on the information of the target current Itg newly acquired from the target current acquisition unit 41, the information of the power supply voltage Vcc acquired from the voltage determination unit 48, and the information of the duty ratio of the PWM signal acquired from the current feedback control unit 43.

Furthermore, the overcurrent threshold setting unit 47 changes the overcurrent threshold Ith based on the effective value Ie of the motor current that is a conversion result of the A/D converter 45, and the target current Itg. That is, after setting the initial value Ith0 of the overcurrent threshold Ith, the overcurrent threshold setting unit 47 changes the overcurrent threshold Ith from the initial value Ith0 based on the relative magnitude of the conversion result of the A/D converter 45 (effective value Ie of the motor current) with respect to the target current Itg.

Figure 3:
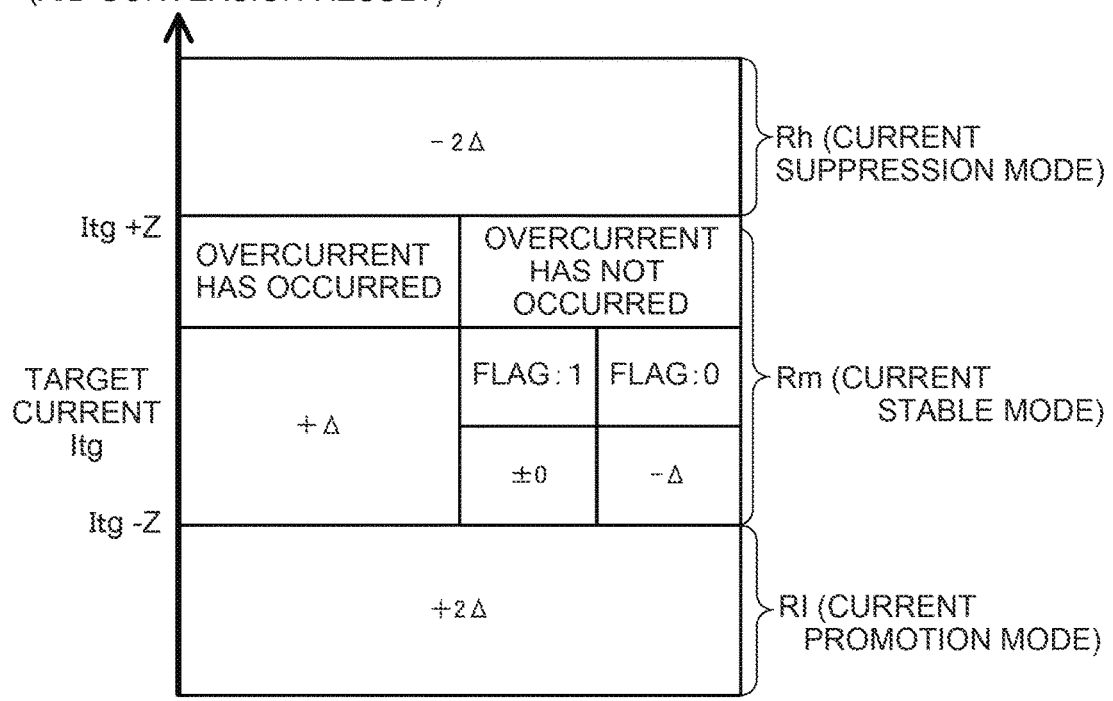
FIG. 3 is a diagram illustrating a method of changing an overcurrent threshold Ith.

FIG. 3 is a diagram illustrating a method of setting the overcurrent threshold Ith by the overcurrent threshold setting unit 47.

FIG. 3 illustrates an adjustment amount of the overcurrent threshold Ith corresponding to the magnitude of the effective value Ie of the motor current with respect to the target current Itg during the constant current control.

In FIG. 3, a minimum adjustment amount of the overcurrent threshold Ith is represented by "Δ." In FIG. 3, the effective value Ie of the motor current that is in a current range of "Itg±Z" with respect to the target current Itg is represented by a reference symbol Rm, the effective value Ie of the motor current that is in a current range larger than "Itg+Z" is represented by a reference symbol Rh, and the effective value Ie of the motor current that is in a current range smaller than "Itg-Z" is represented by a reference symbol Rl.

Here, the predetermined current range Rm is a range where the motor current of the motor 20 is deemed to be stable with respect to the target current Itg. The predetermined current range Rm can be adjusted by appropriately varying the magnitude of the current value "Z."

The overcurrent threshold setting unit 47 changes an adjustment amount of the overcurrent threshold Ith depending on which range among the current ranges Rh, Rm and Rl the effective value Ie of the motor current (conversion result of the A/D converter 45) is in. That is, the overcurrent threshold setting unit 47 switches an operation mode for adjusting the overcurrent threshold Ith depending on the current range in which the effective value Ie of the motor current exists.

Hereinafter, the operation mode when the effective value Ie of the motor current is in the current range Rh is referred to as a "current suppression mode," the operation mode when the effective value Ie of the motor current is in the current range Rl is referred to as a "current promotion mode," and the operation mode when the effective value Ie of the motor current is in the predetermined current range Rm is referred to as a "current stable mode."

The overcurrent threshold setting unit 47 reduces the overcurrent threshold Ith when the effective value Ie of the motor current is larger than the target current Itg. More specifically, the overcurrent threshold setting unit 47 reduces the overcurrent threshold Ith when the effective value Ie of the motor current is larger than the predetermined current range Rm taking the target current Itg as a reference. For example, as illustrated in FIG. 3, when the effective value Ie of the motor current is in the current range Rh, the overcurrent threshold setting unit 47 goes into the current suppression mode, and reduces the last set overcurrent threshold Ith by "2Δ."

That is, since the overcurrent threshold setting unit 47 needs to reduce the motor current to the target current Itg rapidly when the effective value Ie of the motor current is larger than the predetermined current range Rm, the overcurrent threshold setting unit 47 reduces the overcurrent threshold Ith greatly. Accordingly, overcurrent protection is prone to be activated on the motor current, and therefore the motor current can be rapidly reduced actively using an overcurrent protection function.

On the other hand, when the effective value Ie of the motor current is smaller than the target current Itg, the overcurrent threshold setting unit 47 increases the overcurrent threshold Ith. More specifically, the overcurrent threshold setting unit 47 increases the overcurrent threshold Ith when the effective value Ie of the motor current is smaller than the predetermined current range Rm. For example, as illustrated in FIG. 3, in the current promotion mode in which the effective value Ie of the motor current is in the current range Rl, the overcurrent threshold setting unit 47 increases the last set overcurrent threshold Ith by "2Δ."

That is, since the overcurrent threshold setting unit 47 needs to increase the motor current to the target current Itg rapidly when the effective value Ie of the motor current is smaller than the predetermined current range Rm, the overcurrent threshold setting unit 47 increases the overcurrent threshold Ith greatly. Accordingly, the motor current can be rapidly increased to the target current Itg without the increase in the motor current being inhibited by the overcurrent protection function.

The overcurrent threshold setting unit 47 sets the overcurrent threshold Ith based on the determination result of the overcurrent determination unit 46 when the effective value Ie of the motor current is in the predetermined current range Rm. That is, since when the effective value Ie of the motor current is in the predetermined current range Rm, the overcurrent protection function is frequently activated due to change in the overcurrent threshold Ith, to thereby prevent the motor current from being unstable, the overcurrent threshold Ith needs to be stabilized. Therefore, in the current stable mode, the overcurrent threshold setting unit 47 finely adjusts the overcurrent threshold Ith based on whether the overcurrent has occurred.

More specifically, in the current stable mode in which the effective value Ie of the motor current is in the predetermined current range Rm, the overcurrent threshold setting unit 47 increases the overcurrent threshold Ith when the overcurrent determination unit 46 determines that the overcurrent has occurred. For example, as illustrated in FIG. 3, when the effective value Ie of the motor current is in the predetermined current range Rm and the overcurrent has occurred in the motor 20, the overcurrent threshold setting unit 47 increases the last set overcurrent threshold Ith by "Δ."

On the other hand, in the current stable mode in which the effective value Ie of the motor current is in the predetermined current range Rm, the overcurrent threshold setting unit 47 sets the overcurrent threshold Ith based on the occurrence history of the overcurrent when the overcurrent determination unit 46 determines that the overcurrent has not occurred.

For example, the overcurrent threshold setting unit 47 includes a storage unit 470 for indicating the occurrence history of the overcurrent. The storage unit 470 is, for example, a register. When the overcurrent has occurred after the motor current has fallen within the predetermined current range Rm (after the overcurrent threshold setting unit 47 has been placed into the current stable mode), a value "1" is set to the storage unit 470. When the overcurrent has never occurred after the mode current has fallen within the predetermined current range Rm (after the overcurrent threshold setting unit 47 has been placed into the current stable mode), a value "0" is set to the storage unit 470. Hereinafter, the storage unit 470 is also referred to as a "flag 470."

The overcurrent threshold setting unit 47 determines whether the overcurrent has occurred, based on the determination signal Scmp of the overcurrent determination unit 46. When the overcurrent has occurred in the current stable mode, the overcurrent threshold setting unit 47 sets "1" to the flag 470. On the other hand, when the effective value Ie of the motor current is outside the predetermined current range Rm (the current suppression mode or the current promotion more), the overcurrent threshold setting unit 47 sets "0" to the flag 470. That is, when the overcurrent has occurred at least once after the motor current has fallen within the predetermined current range Rm stably, the overcurrent threshold setting unit 47 sets "1" to the storage unit 470, and then, when the motor current has fallen outside the predetermined current range Rm, the overcurrent threshold setting unit 47 resets the storage unit 470 to "0."

In the current stable mode, the overcurrent threshold setting unit 47 reduces the overcurrent threshold Ith by "4" when the overcurrent has not occurred in the motor 20 and the value "0" is set to the flag 470. On the other hand, the overcurrent threshold setting unit 47 maintains the last set overcurrent threshold Ith without changing the overcurrent threshold Ith (adjustment amount: ±0) when the overcurrent has not occurred in the motor 20 and the value "1" is set to the flag 470.

In this manner, when the effective value Ie of the motor current is in the predetermined current range Rm, the overcurrent threshold Ith is not changed or is finely adjusted, whereby the overcurrent protection function can be frequently activated to prevent the motor current from being unstable.

Thereafter, the flow of a process of setting the overcurrent threshold Ith by the control circuit 4 will be described.

Figure 4:
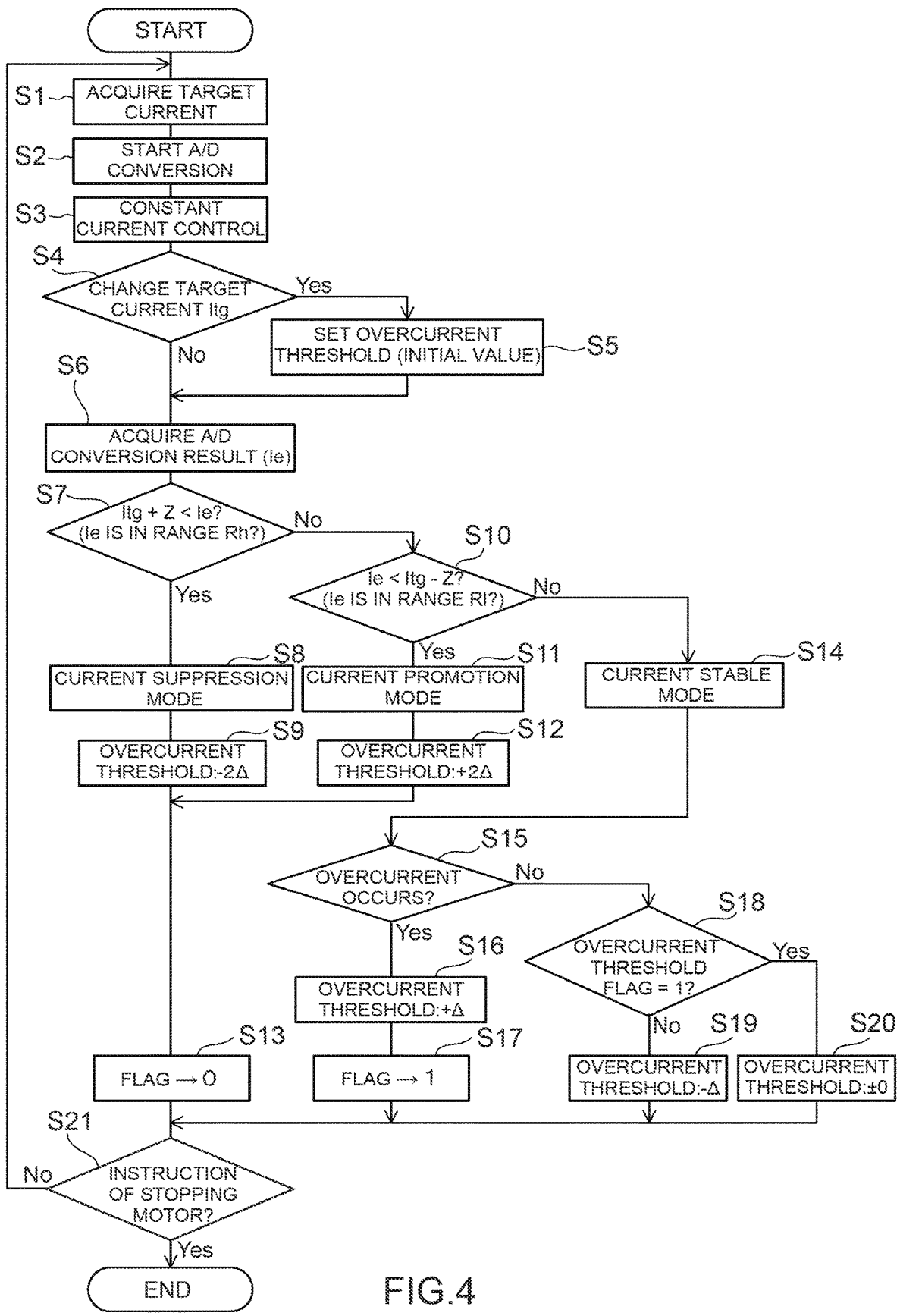
FIG. 4 is a flowchart illustrating a flow of a process of setting the overcurrent threshold Ith.

FIG. 4 is a flowchart illustrating the flow of the process of setting the overcurrent threshold Ith according to the present embodiment.

Firstly, when the current command signal Si is input to the motor unit 100 from the host device, the target current acquisition unit 41 acquires the information of the target current Itg from the current command signal Si (step S1). The target current acquisition unit 41 supplies the acquired information of the target current Itg to the current feedback control unit 43 and the overcurrent threshold setting unit 47, and instructs the A/D converter 45 to execute the A/D conversion processing.

Subsequently, the A/D converter 45 starts the A/D conversion processing for the voltage Vs output from the current detection circuit 6 (step S2).

Subsequently, the drive control signal generation unit 42 starts the constant current control of the motor 20 (step S3). More specifically, the current feedback control unit 43 generates the PWM command signal Spwm for making the motor current of the motor 20 serving as the control target equal to the target current Itg, and the signal generation unit 44 supplies, to the motor drive unit 2, the drive control signal Sd (PWM signal) having the duty ratio designated by the PWM command signal Spwm, whereby the constant current control of the motor current is performed.

Note that the current feedback control unit 43 outputs the information of the duty ratio of the PWM signal to the overcurrent threshold setting unit 47 every time the duty ratio of the PWM signal calculated during the constant current control is changed.

Subsequently, the overcurrent threshold setting unit 47 determines whether the target current Itg is changed (step S4).

When the target current Itg is changed or the information of the target current Itg is acquired for the first time after the activation of the motor unit 100 in step S4, the overcurrent threshold setting unit 47 sets the initial value Ith0 of the overcurrent threshold Ith (step S5).

More specifically, the overcurrent threshold setting unit 47 sets the initial value Ith0 of the overcurrent threshold Ith by the above-described method based on the information of the target current Itg acquired from the target current acquisition unit 41, the information of the duty ratio of the PWM signal acquired from the current feedback control unit 43, and the information of the power supply voltage Vcc acquired from the voltage determination unit 48. Accordingly, the overcurrent determination unit 46 performs the overcurrent determination using the overcurrent threshold Ith set in step S5.

On the other hand, when the target current Itg is not changed in step S4, or the initial value Ith0 of the overcurrent threshold Ith is set in step S5, the overcurrent threshold setting unit 47 acquires the A/D conversion result, i.e., the effective value Ie of the motor current from the A/D converter 45 (step S6).

The overcurrent threshold setting unit 47 determines whether the effective value Ie of the motor current acquired in step S6 is in the current range Rh (step S7).

When the effective value Ie of the motor current is in the current range Rh (in the case of Yes: Itg+Z<Ie) in step S7, the overcurrent threshold setting unit 47 is placed into the current suppression mode (step S8). In the current suppression mode, the overcurrent threshold setting unit 47 reduces the set overcurrent threshold Ith by "2Δ" (step S9). Accordingly, the overcurrent determination unit 46 performs the overcurrent determination using the overcurrent threshold Ith set in step S9.

On the other hand, when the effective value Ie of the motor current is not in the current range Rh (in the case of No: Itg+Z> Ie) in step S7, the overcurrent threshold setting unit 47 determines whether the effective value Ie of the motor current is in the current range Rl (step S10).

When the effective value Ie of the motor current is in the current range Rl (in the case of Yes: Itg−Z> Ie) in step S10, the overcurrent threshold setting unit 47 is placed into the current promotion mode (step S11). In the current promotion mode, the overcurrent threshold setting unit 47 increases the set overcurrent threshold Ith by "2Δ." Accordingly, the overcurrent determination unit 46 performs the overcurrent determination using the overcurrent threshold Ith set in step S12.

After step S9 and step S12, the overcurrent threshold setting unit 47 sets "0" to the flag 470 (step S13).

On the other hand, when the effective value Ie of the motor current is not in the current range RI (in the case of No: Itg−Z<Ie) in step S10, the overcurrent threshold setting unit 47 determines that the effective value Ie of the motor current is in the predetermined current range Rm, and is placed into the current stable mode (step S14).

In the current stable mode, the overcurrent threshold setting unit 47 determines whether the overcurrent has occurred in the motor 20 (step S15). More specifically, the overcurrent threshold setting unit 47 determines whether the overcurrent has occurred in the motor 20 based on the determination signal Scmp of the overcurrent determination unit 46.

When the overcurrent has occurred (in the case of Yes) in step S15, the overcurrent threshold setting unit 47 increases the overcurrent threshold Ith by "Δ" (step S16). Then, the overcurrent threshold setting unit 47 sets "1" to the flag (step S17).

On the other hand, when the overcurrent has not occurred in step S15 (in the case of No), the overcurrent threshold setting unit 47 determines whether "1" is set to the flag 470 (step S18).

When "1" is not set to the flag 470 (in the case of No) in step S18, the overcurrent threshold setting unit 47 reduces the overcurrent threshold Ith by "Δ" (step S19). On the other hand, when "1" is set to the flag 470 in step S18, the overcurrent threshold setting unit 47 does not change the overcurrent threshold Ith (step S20).

After step S13, step S17, step S19 and step S20, the control circuit 4 determines the presence or absence of an instruction of stopping the motor 20 (step S21). In the absence of the instruction of stopping the motor 20 (in the case of No) in step S21, the above-described processes (S1 to S21) are repeatedly performed. On the other hand, when the instruction of stopping the motor 20 is received (in the case of Yes) in step S21, the process of setting the overcurrent threshold Ith by the control circuit 4 is ended.

Figure 5:
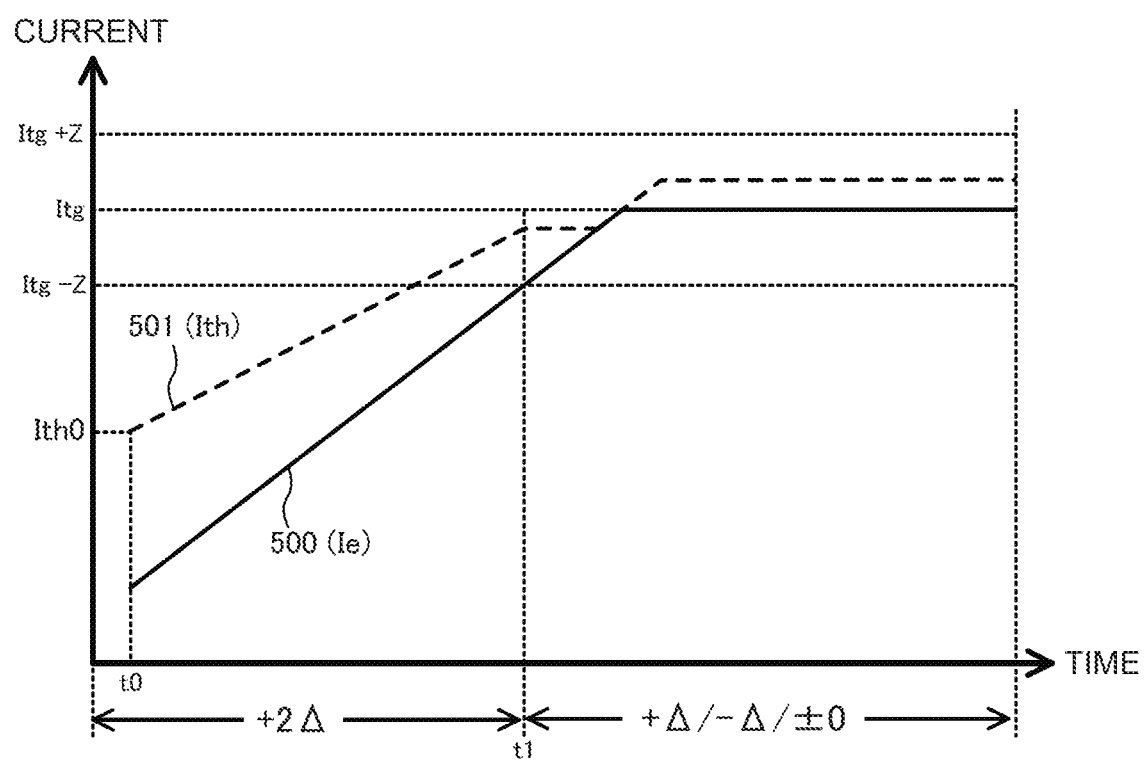
FIG. 5 is a graph showing how an effective value Ie of a motor current and the overcurrent threshold Ith are changed in the motor unit according to the present embodiment.

FIG. 5 is a graph showing how the effective value Ie of the motor current and the overcurrent threshold Ith are changed in the motor unit according to the present embodiment.

In FIG. 5, reference numeral 500 denotes the effective value Ie of the motor current, and reference numeral 501 denotes the overcurrent threshold Ith. FIG. 5 shows an example of changes in the effective value Ie of the motor current and the overcurrent threshold Ith after the activation of the motor unit 100.

As shown in FIG. 5, the target current Itg is set at a time t0 after the activation of the motor unit 100. After the target current Itg is set, the current feedback control unit 43 starts the constant current control so that the motor current of the motor 20 is equal to the target current Itg. The overcurrent threshold setting unit 47 sets the initial value Ith0 of the overcurrent threshold Ith based on the information of the set target current Itg and the like.

Thereafter, the overcurrent threshold setting unit 47 adjust the overcurrent threshold Ith based on the target current Itg and the conversion result (effective value Ie of the motor current) of the A/D converter 45. More specifically, since after the time t0, the effective value Ie of the motor current is sufficiently lower than the target current Itg, the overcurrent threshold setting unit 47 is placed into the current promotion mode, and increases the overcurrent threshold Ith by a unit of "2Δ." Thereafter, when the effective value Ie of the motor current exceeds "Itg−Z" and is placed into the predetermined current range Rm at a time t1, the overcurrent threshold setting unit 47 is placed into the current stable mode, and finely adjusts the overcurrent threshold Ith by a unit of "Δ" depending on the presence or absence of the occurrence of the overcurrent. When the effective value Ie of the motor current is equal to the target current Itg, the overcurrent threshold Ith is stabilized.

Figure 6A:
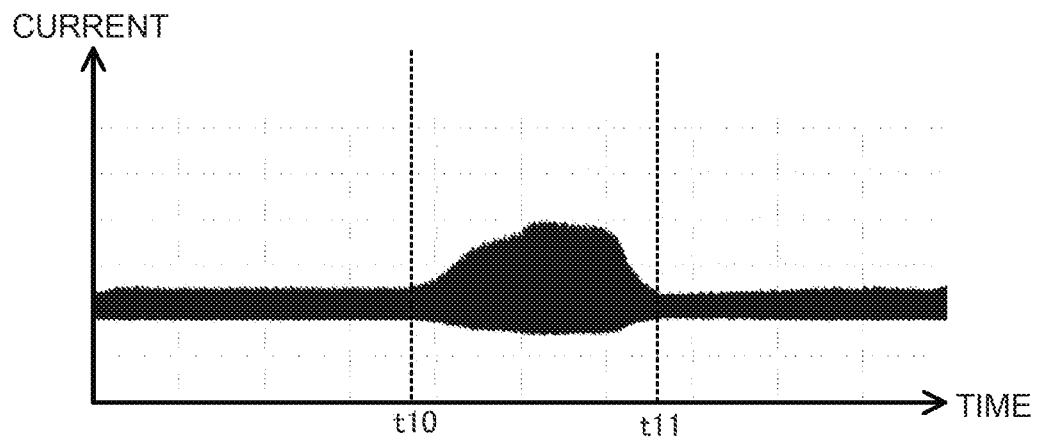
FIG. 6A is a graph showing a change in a motor current controlled by a conventional motor drive control device as a comparative example of the motor drive control device according to the present embodiment.

FIG. 6A is a graph showing an example of a change in the motor current controlled by a conventional motor drive control device as a comparative example of the motor drive control device 1 according to the present embodiment.

Figure 6B:
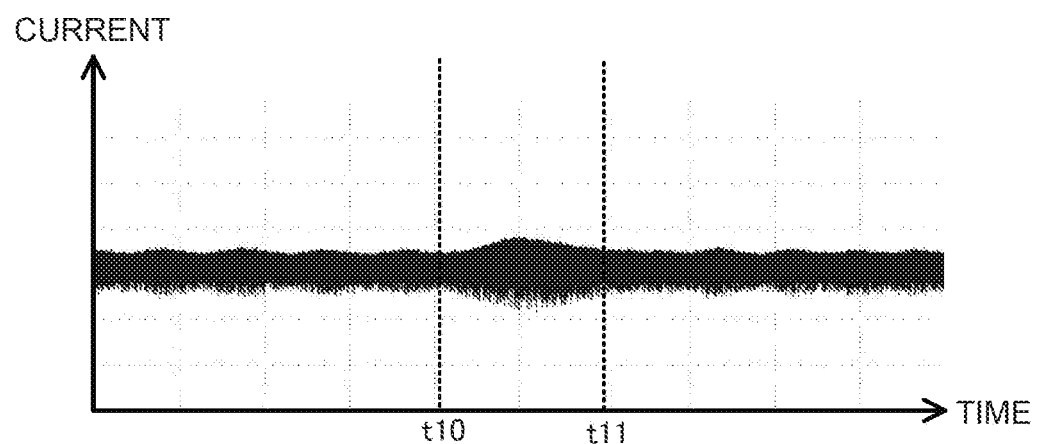
FIG. 6B is a graph showing an example of a change in the motor current controlled by the motor drive control device according to the present embodiment.

FIG. 6B is a graph showing an example of a change in the motor current of the motor 20 controlled at a constant current by the motor drive control device 1 according to the present embodiment.

FIG. 6A shows a change in the motor current of the motor 20 when the constant current control is performed by the conventional motor drive control device having the overcurrent threshold Ith which is a fixed value. FIG. 6B shows a change in the motor current of the motor 20 when the constant current control is performed by the motor drive control device 1 according to the present embodiment.

As shown in FIG. 6A, when a load of the motor 20 is increased rapidly in a period from a time t10 to a time t11, for example, during the constant current control of the motor 20 by the conventional motor drive control device, the motor current of the motor 20 is increased by a factor of two or more. This phenomenon is assumed to be because the motor current is increased until the overcurrent protection function is activated, since the overcurrent threshold Ith of the overcurrent protection function is set at a level sufficiently higher than the target current Itg.

On the other hand, according to the motor drive control device 1 according to the present embodiment, even when the load of the motor 20 is increased rapidly in a period from a time t10 to a time t11, similarly to FIG. 6A, an increase in the motor current of the motor 20 can be suppressed as shown in FIG. 6B. As described above, in the motor drive control device 1 according to the present embodiment, the overcurrent threshold Ith changes based on the relative magnitude of the motor current with respect to the target current Itg, and is reduced to a level close to the target current, whereby the overcurrent protection function is prone to be activated as compared with the conventional motor drive control device. Accordingly, even when the current cannot be adjusted by the control loop of the constant current control to keep pace with the rapid change in the load, an increase in the motor current can be suppressed by the control loop of the overcurrent protection.

In this way, the control circuit 4 of the motor drive control device 1 according to the present embodiment includes the A/D converter 45 configured to convert a detection value of a motor current of the motor 20 serving as a control target into a digital signal, the overcurrent determination unit 46 configured to determine whether the motor current exceeds the overcurrent threshold Ith to determine whether the overcurrent has occurred, the drive control signal generation unit 42 configured to generate the drive control signal Sd for controlling driving of the motor 20 so that the motor current is equal to the target current Itg and generate the drive control signal Sd to reduce the motor current when the overcurrent determination unit 46 determines that the motor current has exceeded the overcurrent threshold Ith, and the overcurrent threshold setting unit 47 configured to set the overcurrent threshold Ith based on the conversion result of the detection value of the motor current from the A/D converter 45 and the target current Itg.

That is, during the constant current control of the motor 20, the control circuit 4 according to the present embodiment varies the overcurrent threshold Ith for preventing breakage of the motor 20 based on the relative magnitude of the detection value of the motor current (A/D conversion result) with respect to the target current Itg, to actively activate the overcurrent protection function, and controls so that the motor current does not greatly exceed the target current Itg.

In the other words, the control circuit 4 actively uses the overcurrent threshold Ith not only for preventing breakage of the motor 20 of the conventional motor drive control device but also for controlling so the motor current does not greatly exceed the target current Itg in the constant current control of the motor current.

In this way, since the overcurrent protection function makes up for a delay in the constant current control process of the motor current that is associated with increase in the A/D conversion processing time by $\Delta\Sigma$ADC even when the constant current control is performed based on the effective value Ie of the motor current by applying $\Delta\Sigma$ADC to the A/D converter 45, the control circuit 4 can control so that the motor current does not greatly exceed the target current Itg as shown in FIG. 6B.

More specifically, in the control circuit 4, the overcurrent threshold setting unit 47 reduces the overcurrent threshold Ith when the conversion result (effective value Ie of the motor current) of the A/D converter 45 is larger than the target current Itg, and increases the overcurrent threshold Ith when the conversion result of the A/D converter 45 is smaller than the target current Itg.

In this way, when the motor current is larger than the target current Itg, the overcurrent protection function is prone to be activated, so that the motor current is reduced rapidly. When the motor current is smaller than the target current Itg, the motor current can be rapidly increased to the target current Itg without the increase in the motor current being inhibited by the overcurrent protection function.

More specifically, when the conversion result (effective value Ie of the motor current) of the A/D converter 45 is larger than a predetermined current range Rm taking the target current Itg as a reference, the overcurrent threshold setting unit 47 reduces the overcurrent threshold Ith. When the conversion result (effective value Ie of the motor current) of the A/D converter 45 is smaller than a predetermined current range Rm, the overcurrent threshold setting unit 47 increases the overcurrent threshold Ith. When the conversion result (effective value Ie of the motor current) of the A/D converter 45 is in the predetermined current range Rm, the overcurrent threshold setting unit 47 sets the overcurrent threshold Ith based on the determination result by the overcurrent determination unit 46.

That is, as described above, when the effective value Ie of the motor current is in the current range Rh larger than the target current Itg, the overcurrent threshold setting unit 47 is placed into the "current suppression mode" to control so that the overcurrent protection function prevents the motor current from being greatly increased. When the effective value Ie of the motor current is in the current range Rl smaller than the target current Itg, the overcurrent threshold setting unit 47 is placed into the "current promotion mode" to control so that the overcurrent protection function does not inhibit the increase in the motor current. When the effective value Ie of the motor current is in the predetermined current range Rm, the overcurrent threshold setting unit 47 is placed into the "current stable mode" and finely adjust the overcurrent threshold Ith based on the presence or absence of the occurrence of the overcurrent.

In this way, since a method of adjusting the overcurrent threshold Ith is changed based on the magnitude of the motor current with respect to not the target current Itg itself but respect to the predetermined current range including the target current Itg, the overcurrent threshold Ith can be prevented from being excessively changed in situations where the motor current has approached the target current Itg, and the stable motor operation can be achieved.

In particular, the adjustment amount ($\pm\Delta$) of the overcurrent threshold Ith when the effective value Ie of the motor current is in the predetermined current range Rm is made smaller than the adjustment amount ($\pm 2\Delta$) of the overcurrent threshold Ith when the effective value Ie of the motor current is outside the predetermined current range Rm (current ranges Rh and Rl), whereby the change in the overcurrent threshold Ith can be suppressed in the situations where the motor current has approached the target current Itg, to thereby achieve more stable motor operation.

More specifically, when the overcurrent has occurred when the effective value Ie of the motor current is in the predetermined current range Rm, the overcurrent threshold setting unit 47 increases the overcurrent threshold Ith.

In this way, when the effective value Ie of the motor current is in the predetermined current range Rm in which the motor current is stable, the determination result by the overcurrent determination unit 46 can be prevented from being frequently switched.

In the event that the overcurrent has not occurred when the effective value Ie of the motor current is in the predetermined current range Rm, the overcurrent threshold setting unit 47 determines the presence or absence of the adjustment of the overcurrent threshold Ith based on the occurrence history of the overcurrent.

For example, as described above, in the event that the overcurrent has occurred once but thereafter the overcurrent has not occurred when the effective value Ie of the motor current is in the predetermined current range Rm, it can be determined that the motor current is stable, and therefore the overcurrent threshold Ith is not changed. This can appropriately prevent the motor current from being unstable due to excessive change of the overcurrent threshold Ith.

On the other hand, since the overcurrent threshold Ith may be too high for the target current Itg in the event that the overcurrent has never occurred when the effective value Ie of the motor current is in the predetermined current range Rm, the overcurrent threshold Ith is reduced by "$\Delta$." This enables the overcurrent threshold Ith to be set at an appropriate level with respect to the target current Itg.

Thus, the effective value Ie of the motor current is in the predetermined current range Rm, the overcurrent threshold Ith is not changed or is finely adjusted, whereby the overcurrent protection function can be frequently activated to prevent the motor current from being unstable.

Furthermore, as described above, the overcurrent threshold setting unit 47 sets the initial value Ith0 of the overcurrent threshold Ith based on the target current Itg, and changes the overcurrent threshold Ith from the above-described initial value Ith0 based on the relative magnitude of the effective value Ie of the motor current with respect to the target current Itg, whereby the overcurrent threshold Ith can be rapidly set to an appropriate value even when the target current Itg is changed.

The motor drive control device 1 in which the control circuit 4 according to the present embodiment is mounted can prevent the motor current controlled at a constant current from greatly exceeding the target current Itg even when the load of the motor 20 is rapidly increased.

Extension of Embodiment

While the disclosure made by the present inventors has been described specifically above with reference to the embodiment, it goes without saying that the present disclosure is not limited to the above description and a variety of modifications can be made without departing from the gist of the disclosure.

For example, although an example in which a control target of the control circuit 4 as an example of a semiconductor device is the motor 20 is illustrated in the above-described embodiment, the control target is not limited to the motor 20. That is, even when the control target is not a motor, the semiconductor device in the present disclosure can detect a current flowing in the control target and analog-to-digital convert it, and control based on the A/D conversion result so that the current flowing in the control target is constant.

Although an example in which the adjustment amounts of the overcurrent threshold Ith are ±Δ and ±2Δ is illustrated in the above-described embodiment, the adjustment amounts are not limited to ±Δ and ±2Δ, and may be modified in various manners according to the system to be applied.

Although an example in which the motor 20 is a three-phase brushless motor is illustrated in the above-described embodiment, the type of the motor 20 and the number of phases are not limited to this example. For example, the motor 20 may be a single-phase brushless motor.

Although the above-described flowchart illustrates an example for describing the operation, the flowchart is not limited this example. That is, the steps illustrated in each figure of the flowchart are specific examples, and are not limited to this flow. For example, the order of some processes may be changed, another process may be inserted between processes, or some processes may be performed in parallel.

What is claimed is:

1. A semiconductor device, comprising:
an A/D converter configured to convert an analog signal representing a current flowing in a control target into a digital signal;
an overcurrent determination unit configured to, based on the analog signal, determine that an overcurrent has occurred in the control target when the current flowing in the control target has exceeded an overcurrent threshold, and determine that the overcurrent has not occurred in the control target when the current flowing in the control target has not exceeded the overcurrent threshold;
a drive control signal generation unit configured to generate a drive control signal for controlling driving of the control target so that the current flowing in the control target is equal to a target current, based on a conversion result of the A/D converter, and generate the drive control signal to reduce the current flowing in the control target when the overcurrent determination unit determines that the overcurrent has occurred; and
an overcurrent threshold setting unit configured to set the overcurrent threshold based on the conversion result of the A/D converter and the target current.

2. The semiconductor device according to claim 1, wherein
the overcurrent threshold setting unit reduces the overcurrent threshold when the conversion result of the A/D converter is larger than the target current, and increases the overcurrent threshold when the conversion result of the A/D converter is smaller than the target current.

3. The semiconductor device according to claim 2, wherein
the overcurrent threshold setting unit reduces the overcurrent threshold when the conversion result of the A/D converter is larger than a predetermined current range taking the target current as a reference, increases the overcurrent threshold when the conversion result of the A/D converter is smaller than the predetermined current range, and sets the overcurrent threshold based on a determination result by the overcurrent determination unit when the conversion result of the A/D converter is in the predetermined current range.

4. The semiconductor device according to claim 3, wherein
an adjustment amount of the overcurrent threshold when the conversion result of the A/D converter is in the predetermined current range is smaller than an adjustment amount of the overcurrent threshold when the conversion result of the A/D converter is out of the predetermined current range.

5. The semiconductor device according to claim 3, wherein
the overcurrent threshold setting unit increases the overcurrent threshold in the event that the overcurrent determination unit determines that the overcurrent has occurred when the conversion result of the A/D converter is in the predetermined current range.

6. The semiconductor device according to claim 5, wherein
the overcurrent threshold setting unit determines whether the overcurrent threshold has been changed, based on an occurrence history of the overcurrent in the event that the overcurrent determination unit determines that the overcurrent has not occurred when the conversion result of the A/D converter is in the predetermined current range.

7. The semiconductor device according to claim 1, wherein
the overcurrent threshold setting unit changes an initial value of the overcurrent threshold in response to the change of the target current, and changes the overcurrent threshold from the initial value based on a relative magnitude of the conversion result of the A/D converter with respect to the target current.

8. A motor drive control device, comprising:
the semiconductor device according to claim 1;
a current detection circuit configured to output a voltage corresponding to a current flowing in a motor serving as a control target; and
a motor drive unit configured to drive the motor based on the drive control signal generated by the semiconductor device,
wherein the semiconductor device inputs a voltage output from the current detection circuit as the analog signal.

9. A motor unit, comprising:
the motor drive control device according to claim 8; and
the motor.

* * * * *